US012805129B2

(12) United States Patent
Kwon et al.

(10) Patent No.: US 12,805,129 B2
(45) Date of Patent: Nov. 17, 2026

(54) LIGHT-EMITTING DISPLAY DEVICE

(71) Applicant: LG DISPLAY CO., LTD., Seoul (KR)

(72) Inventors: JunYoung Kwon, Paju-si (KR); Yein Hong, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 339 days.

(21) Appl. No.: 18/212,916

(22) Filed: Jun. 22, 2023

(65) Prior Publication Data

US 2024/0164160 A1 May 16, 2024

(30) Foreign Application Priority Data

Nov. 14, 2022 (KR) ........................ 10-2022-0151391

(51) Int. Cl.
*H10K 59/131* (2023.01)
*H10K 59/121* (2023.01)
*H10K 77/10* (2023.01)

(52) U.S. Cl.
CPC ....... *H10K 59/131* (2023.02); *H10K 59/1213* (2023.02); *H10K 59/1216* (2023.02); *H10K 77/111* (2023.02)

(58) Field of Classification Search
CPC ............. H10K 59/131; H10K 59/1213; H10K 59/1216; H10K 77/111; H10K 59/124; H10K 59/8723; H10K 59/873; H10K 50/844
See application file for complete search history.

(56) References Cited

U.S. PATENT DOCUMENTS

2017/0287995 A1 10/2017 Kim et al.
2017/0373128 A1 12/2017 Lee et al.
2019/0012031 A1* 1/2019 Kim ..................... H10K 50/805
2020/0301535 A1 9/2020 Choi et al.
2022/0020955 A1 1/2022 Lee et al.
2022/0149131 A1* 5/2022 Lee ...................... H10K 77/111
2024/0130175 A1* 4/2024 Shang .................. H10K 59/873
2024/0365643 A1* 10/2024 Li .......................... H10K 50/81

FOREIGN PATENT DOCUMENTS

KR 10-2017-0115149 A 10/2017
KR 10-2018-0001717 A 1/2018
KR 10-2020-0113065 A 10/2020
KR 10-2022-0009851 A 1/2022

* cited by examiner

*Primary Examiner* — J. E. Schoenholtz
(74) *Attorney, Agent, or Firm* — Morgan, Lewis & Bockius LLP

(57) ABSTRACT

A disclosed light-emitting display device may include: a substrate including an active area and a non-active area, the non-active area including a first portion adjacent to the active area, a second portion adjacent to the first portion, and a third portion adjacent to the second portion in a first direction away from the active area; a planarization layer disposed in the active area and in the first portion and the third portion of the non-active area; and a power line disposed in the first portion and the second portion of the non-active area. The power line may be spaced apart from the planarization layer in the third portion of the non-active area.

20 Claims, 5 Drawing Sheets

LIGHT-EMITTING DISPLAY DEVICE

CROSS REFERENCE TO RELATED APPLICATION

This application claims priority benefit from Korean Patent Application No. 10-2022-0151391, filed on Nov. 14, 2022, the entire contents of which are hereby expressly incorporated by reference for all purposes as if fully set forth herein.

BACKGROUND

Technical Field

The present disclosure relates to a light-emitting display device and, more particularly, for example, without limitation, to a light-emitting display device having a structure for reducing or preventing the permeation of external moisture.

Description of the Related Art

Recent display devices configured to display various types of information while interacting with a user viewing the information have various sizes, various shapes, and various functions.

These display devices may include liquid crystal display devices (LCDs), electrophoretic display devices (FPDs), light-emitting display devices (also referred to as light-emitting diode (LED) display devices), and the like.

Light-emitting display devices are self-emitting display devices and may be fabricated with a light and thin profile since no separate light source is required unlike in the case of LCDs. In addition, LED display devices are not only advantageous in terms of power consumption due to low voltage driving but are also superior in terms of color reproduction, response rate, viewing angle, and contrast ratio (CR). Therefore, light-emitting display devices are being researched as next-generation displays.

It will be described hereinafter on the assumption that light-emitting display devices are organic light-emitting display devices (OLED). However, the type of a light-emitting device layer is not limited thereto.

Light-emitting display devices respectively display information on a screen by generating light from a plurality of pixels each including a light-emitting device layer including an emitting layer. Light-emitting display devices may be categorized as an active matrix light-emitting display device and a passive matrix light-emitting display device.

The active matrix light-emitting display device displays an image by controlling current flowing through a light-emitting diode (LED) using a thin-film transistor (TFT).

The light-emitting display device includes an anode, an emitting layer, and a cathode. When a voltage is applied to the anode and the cathode, holes from the anode move to the emitting layer, while electrons from the cathode move to the emitting layer. When holes and electrons recombine in the emitting layer, excitons are generated during excitation, and light is generated by energy from excitons.

As light-emitting display devices are being used for various applications, the design of light-emitting display devices is being diversified to reduce the size of a non-active area in which no images are displayed in order to meet user aesthetic desires. Here, the high ratio of the size of an active area with respect to the size of the non-active area is an important design challenge.

In order to overcome this challenge, research is being conducted with respect to using a flexible material as a substrate of a light-emitting display device and folding or bending several portions of the light-emitting display device using the flexible nature of the flexible substrate. The entirety or a portion of the non-active area is folded and disposed behind the active area by bending the flexible substrate, so that the non-active area is concealed from a user. Thus, a display device having an increased ratio of the active area visible to a user may be provided.

The description of the related art provided in this section should not be assumed to be prior art merely because it is mentioned in or associated with the description of the related art section. The description of the related art section may include information that describes one or more aspects of the subject technology.

SUMMARY

The present disclosure is directed to a light-emitting display apparatus that substantially obviates one or more of the problems due to limitations and disadvantages of the related art.

The high ratio of the size of an active area with respect to the size of the non-active area brings about other potential issues in the light-emitting display device. For example, external moisture or oxygen may permeate into the active area through power lines disposed in the non-active area of the substrate of the light-emitting display device. The moisture or oxygen having permeated into the active area may interfere with image driving in the active area, thereby causing abnormal image display issues.

In this regard, a variety of attempts are being carried out in order to prevent or reduce moisture or oxygen that has entered a non-active area of a light-emitting display device from permeating into an active area. However, such attempts remain insufficient, and further development in this area is needed.

The inventors have recognized the needs described above and the limitations and disadvantages associated with the related art. Accordingly, embodiments of the present disclosure provide a light-emitting display device having a configuration in which at least a portion of a planarization layer is spaced apart from a power line disposed in a non-active area to block a path by which moisture or oxygen that has entered the non-active area may infiltrate an active area.

Also, embodiments of the present disclosure provide a light-emitting display device further including a blocking layer between a power line disposed in a non-active area and a planarization layer to block a path by which moisture or oxygen that has entered the non-active area may infiltrate an active area.

Additional features and aspects of the disclosure will be set forth in the description that follows and in part will become apparent from the description or may be learned by practice of the inventive concepts provided herein. Other features and aspects of the inventive concepts may be realized and attained by the structure particularly pointed out in, or derivable from, the written description, claims hereof, and the appended drawings.

To achieve these and other aspect of the inventive concepts, as embodied and broadly described herein, a light-emitting display device may include: a substrate including an active area and a non-active area, the non-active area including a first portion adjacent to the active area, a second portion adjacent to the first portion, and a third portion adjacent to the second portion in a first direction away from the active area; a planarization layer disposed in the active area and in the first portion and the third portion of the non-active area; and a power line disposed in the first portion and the second portion of the non-active area, wherein the power line may be spaced apart from the planarization layer in the third portion of the non-active area.

In the light-emitting display device according to embodiments of the present disclosure, at least a portion of the planarization layer may be spaced apart from the power line disposed in the non-active area so as to block a path by which moisture or oxygen that has entered the non-active area may move toward the active area.

In the light-emitting display device according to embodiments of the present disclosure, the blocking layer may be further disposed between the power line disposed in the active area and the planarization layer to reduce or prevent moisture or oxygen that has entered the non-active area from moving toward the active area.

In the light-emitting display device according to embodiments of the present disclosure, it is possible to prevent or reduce oxygen or moisture from permeating into the active area, thereby obtaining better reliability of a thin-film transistor during driving and improving display quality.

In addition to the above-mentioned advantages of the present disclosure, other features and advantages of the present disclosure will be described below or may be clearly understood by those skilled in the art from such description or explanation.

It is to be understood that both the foregoing general description and the following detailed description of the present disclosure are by way of example and are intended to provide further explanation of the disclosures as claimed.

DESCRIPTION OF DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

Figure 1:
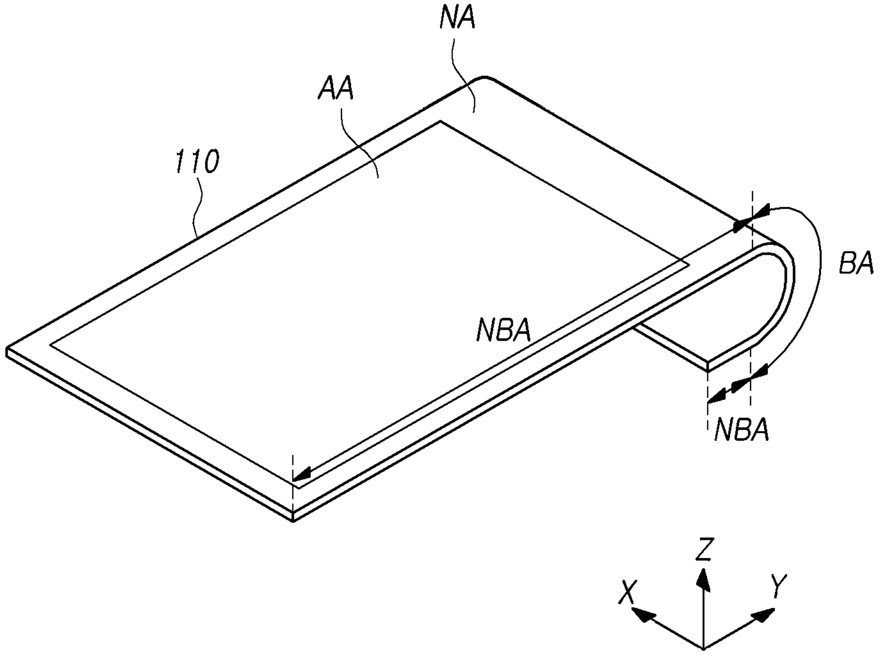
FIG. 1 is a perspective diagram illustrating a light-emitting display device according to an example embodiment of the present disclosure.

Throughout the drawings and the detailed description, unless otherwise described, the same drawing reference numerals should be understood to refer to the same elements, features, or structures. The relative size and depiction of these elements as shown in the drawings may be exaggerated for clarity, illustration, or convenience.

DETAILED DESCRIPTION

Reference will now be made in detail to embodiments of the present disclosure, examples of which may be illustrated in the accompanying drawings. In the following description, where a detailed description of well-known functions or configurations related to this document may unnecessarily obscure aspects of the present disclosure, the detailed description of such known functions or configures may be omitted. The progression of processing steps and/or operations described below is an example. the sequence of steps and/or operations is not limited to that set forth herein and may be changed as is known in the art, with the exception of steps and/or operations specified as necessarily occurring in a particular order. Like reference numerals designate like elements throughout unless otherwise specified. Names of the respective elements used in the following explanations may be selected only for convenience of writing the specification and may thus be different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, areas, ratios, angles, numbers, and the like illustrated in the drawings for describing various example embodiments of the present disclosure are merely examples. Thus, the present disclosure is not limited to such illustrated details in the drawings. In the following description, where the detailed description of the relevant known function or configuration may unnecessarily obscure aspects of the present disclosure, the detailed description of such known function or configuration may be omitted.

Where the terms “comprise,” “have,” “include,” “contain,” “constitute,” “make up of,” “formed of,” and the like are used in the present specification, one or more other elements may be added unless a more limiting term, such as “only,” is used. An element described in the singular form is intended to include a plurality of elements, and vice versa, unless the context clearly indicates otherwise.

In construing an element, the element is to be construed as including an error or tolerance range even where no explicit description of such an error or tolerance range is provided.

Where spatially relative terms, such as “on,” “over,” “above,” “under,” “below,” “beside,” “beneath,” “near,” “close to,” “adjacent to,” “next to,” “on a side of,” or the like, are used herein for descriptions of relationships between one element or component and another element or component, one or more intervening elements or components may be present between the one and the other elements or components, unless a more limiting term, such as “immediate(ly),” “close(ly),” or “direct(ly),” is used.

Where a temporal relationship between processes, operations, flows, steps, events, or the like is described as, for example, “after,” “subsequent,” “next,” or “before,” the relationship encompasses not only a continuous or sequential order but also a non-continuous or non-sequential relationship unless a more limiting term, such as “just,” “immediate(ly),” or “direct(ly),” is used.

Although the terms “first,” “second,” A, B, (a), (b), and the like may be used herein to describe various elements, these elements should not be interpreted to be limited by these terms as they are not used to define a particular essence, order, sequence, or precedence. These terms are used only to distinguish one element from another. For example, a first element could be termed a second element, and, similarly, a second element could be termed a first element, without departing from the scope of the present disclosure.

Where an expression that an element or layer "is connected to," "is coupled to," "is adhered to," "contacts," or "overlaps" another element or layer is used, the element or layer can not only be directly connected, coupled, or adhered to or directly contact or overlap another element or layer, but also be indirectly connected, coupled, or adhered or indirectly contact or overlap another element or layer with one or more intervening elements or layers "disposed" or "interposed" between the elements or layers, unless otherwise specified.

The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

A term "device" used herein may refer to a display device including a display panel and a driver for driving the display panel. Examples of the display device may include a liquid crystal module (LCM), an organic light-emitting diode (OLED) module, and the like. In addition, examples of the device may include a notebook computer, a television, a computer monitor, an automotive device, wearable device, and an automotive equipment device, as well as a set electronic device (or apparatus) or a set device (or apparatus), for example, a mobile electronic device, such as a smartphone or an electronic pad, which are complete products or final products respectively including the LCM, the OLED module, or the like, but embodiments of the present disclosure are not limited thereto.

Thus, the "device" used herein may include a display device, such as an LCM or OLED module, an application device including the LCM, the OLED module, and the like, and a set device that is an end consumer device.

In addition, in some embodiments, the LCM or the OLED module including a display panel, a driver, and the like may be referred to as the "display device," and an electronic device as a final product including the LCM and the OLED module may be referred to as a "set device" to be distinguished from the "display device." For example, the display device may include a display panel, such as an LCD display panel or an OLED display panel, and a source printed circuit board (PCB) serving as a control part to drive the display panel. The set device may further include a set PCB serving as a set control part electrically connected to the source PCB to drive the entirety of the set device.

The display panel according to embodiments of the present disclosure may be implemented as any display panel selected from among a liquid crystal display (LCD) panel, plasma display panel (PDP) panel, field emission display (FED) panel, electroluminescence display (ELD) panel, a mini LED display panel, an OLED display panel, an electroluminescent display panel, and the like, but is not limited thereto. For example, the display panel according to embodiments may be a display panel that may be oscillated by an oscillating device to generate sound. The display panel used in the display device according to example embodiments is not limited to a specific shape or size.

Features of various embodiments of the present disclosure may be partially or entirely coupled to or combined with each other. They may be linked and operated technically in various ways as those skilled in the art can sufficiently understand. The embodiments may be carried out independently of or in association with each other in various combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as may be understood by one of ordinary skill in the art.

Hereinafter, example embodiments of the present disclosure will be described in conjunction with the accompanying drawings. The shapes, sizes, areas, ratios, angles, numbers, and the like illustrated in the drawings for describing various example embodiments of the present disclosure are merely examples. Thus, the present disclosure is not limited to such illustrated details in the drawings.

Hereinafter, example embodiments of the present disclosure will be described in detail with reference to the accompanying drawings.

FIG. 1 is a perspective diagram illustrating a light-emitting display device according to an example embodiment of the present disclosure. All the components of each light-emitting display device according to all example embodiments of the present disclosure may be operatively coupled and configured.

As shown in FIG. 1, a substrate 110 may include a bent area BA and non-bent areas NBA. The non-bent areas NBA may include two or more areas depending on the area of the substrate. For example, the substrate may have a single bent area BA between two non-bent areas NBA, but embodiments of the present disclosure are not limited thereto.

The bent area BA is a curved (or bent) portion of the substrate 110. For example, the bent area BA is a portion of the substrate 110 which may be curved (or bent) to allow a pad part 114 and an external module bonded to the pad part 114 (see, e.g., FIG. 2) to be disposed on the backside of the substrate 110. For example, since the bent area BA may be bent toward the backside of the substrate 110, the external module bonded to the pad part 114 of the substrate 110 may be moved to the backside of the substrate 110. When viewed from above (or the front of) the substrate 110, the externally module may not be visually recognized. In addition, since the bent area BA is bent, the size of a non-active area NA visually recognizable from above (or the front of) the substrate 110 may be reduced to realize a narrow bezel.

The non-bent areas NBA are planar portions of the substrate 110 that are not curved (or bent). The two non-bent areas NBA may face each other.

A plurality of pixels may be disposed in a portion of the non-bent areas NBA. For example, a plurality of pixels may be disposed in an active area AA disposed in one (or each) of the non-bent areas NBA.

Figure 2:
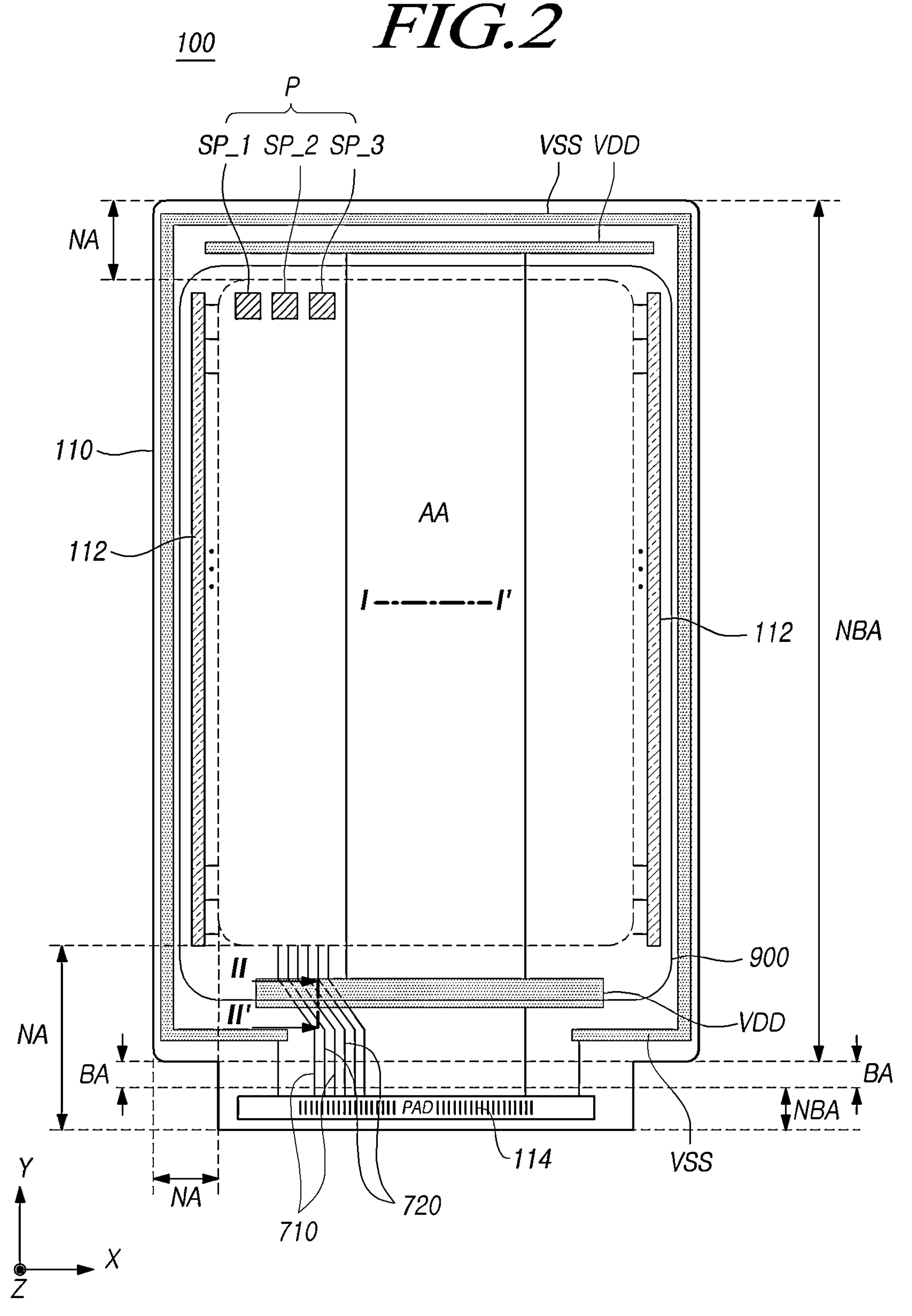
FIG. 2 is a plan diagram illustrating the light-emitting display device according to an example embodiment of the present disclosure.

FIG. 2 is a plan diagram illustrating the light-emitting display device according to an example embodiment of the present disclosure.

As illustrated in FIG. 2, the substrate 110 may include an active area AA and a non-active area NA surrounding the active area AA. The non-active area NA of the substrate 110 may be disposed adjacent to and outside of the active area AA.

The active area AA is an area in which a plurality of subpixels SP are disposed to display images. The subpixels SP are respective units that are configured to emit light. Each of the subpixels SP may emit, for example, red, green, blue, or white light, but is not limited thereto.

The active area AA may include an organic light-emitting diode (OLED). In each of the plurality of subpixels SP, a thin-film transistor and a light-emitting device layer may be disposed. For example, a display diode for displaying an image and a circuit part for driving the display diode may be disposed in the plurality of subpixels SP.

The non-active area NA may be an area in which no image is to be displayed. A variety of conductive lines, driver circuits, and the like for driving the plurality of subpixels SP disposed in the active area AA may be disposed in the non-active area NA. For example, a variety of integrated circuits (ICs), such as a gate driver IC and a data driver IC, driver circuits, and the like, may be disposed in the non-active area NA. The non-active area NA may be a bezel area but is not limited thereto.

As illustrated in FIG. 2, the non-active area NA may be disposed around the active area AA. For example, the non-active area NA may be an area surrounding the active area AA. The non-active area NA may be an area extending from the active area AA. Alternatively, the non-active area NA may be an area in which the plurality of subpixels SP are not disposed, but the non-active area NA is not limited thereto.

Although FIG. 2 illustrates that the non-active area NA surrounds the active area AA having an oblong shape, neither the shape of the active area AA nor the shape and arrangement of the non-active area NA adjacent to the active area AA are limited to the specific illustration of FIG. 2. The shapes and sizes of the active area AA and the non-active area NA may be modified as suitable to the design of an electronic device provided with a display device 100. For example, where the electronic device is a display device wearable by a user, the electronic device may have a circular shape like a wristwatch. The concept of embodiments of the present disclosure may also be applied, for example, to a free-form display device applicable to a vehicle dashboard or the like. The illustrative shape of the active area AA may be one selected from among a rhombus, a pentagon, a hexagon, a circle, and an ellipse, but is not limited thereto.

As shown in FIG. 2, a pixel P in the active area AA may include a plurality of subpixels SPs, for example, SP_1, SP_2, and SP_3, but is not limited thereto. The plurality of subpixels SP may emit red, green, blue, and/or white light.

In each of subpixels SP_1, SP_2, and SP_3, a light-emitting device, such as an organic light-emitting diode (OLED), and a driver circuit may be provided. For example, a display diode for displaying an image and a driver circuit for driving (or controlling) the display diode may be disposed in each of the plurality of subpixels SP_1, SP_2, and SP_3.

Each subpixel SP may include a plurality of transistors, a plurality of capacitors, and a plurality of conductive lines. For example, each subpixel SP may have a 2T1C structure comprised of two transistors and a single capacitor, but the configuration is not limited thereto. The structure of the subpixel SP may be selected from among 3T1C, 4T1C, 5T1C, 6T1C, 7T1C, 3T2C, 4T2C, 5T2C, 6T2C, 7T2C, 8T2C, and the like structures.

The non-active area NA is an area in which a variety of conductive lines, driver circuits, and the like for driving the plurality of subpixels SP_1, SP_2, and SP_3 disposed in the active area AA may be disposed. For example, a variety of ICs, such as a gate driver and a data driver, driver circuits, and the like may be disposed in the non-active area NA.

The light-emitting display device 100 according to an example embodiment of the present disclosure may include a variety of additional elements for generating a variety of signals or driving the plurality subpixels SP_1, SP_2, and SP_3 in the active area AA. For example, the light-emitting display device 100 may include one or more driver circuits for controlling a display panel. The driver circuit for controlling (or driving) the subpixels SP_1, SP_2, and SP_3 may include a gate driver circuit 112, data signal lines, a data driver circuit DDC, a multiplexer MUX, an electrostatic discharge (ESD) circuit, power lines, an inverter circuit, and the like. The power lines may include high voltage lines VDD and/or low voltage lines VSS. The light-emitting display device 100 may also include additional elements for providing other functions in addition to a function of driving the subpixels SP_1, SP_2, and SP_3. For example, the light-emitting display device 100 may include additional elements providing a touch sensing function, a user authentication function (e.g., a fingerprint recognition function, a face recognition function, or a retina recognition function), a multilevel pressure detection function, a tactile feedback function, and the like, but the functions of the additional elements are not limited thereto. The above-stated additional elements may be located in the non-active area NA or on an external circuit connected to a connection interface.

The pad part 114 may be disposed on one side of the non-active area NA. The pad part 114 may be a metal pattern to which an external module, e.g., a flexible printed circuit board (FPCB) or a chip on film (COF), is bonded. Although the pad part 114 is illustrated as being disposed on one side of the substrate 110, the shape or the arrangement of the pad part 114 is not limited thereto.

The gate driver circuit 112 for providing a gate signal to thin-film transistors may be disposed on one or more other sides of the non-active area NA. The gate driver circuit 112 may include a variety of gate driver circuits, which may be directly formed on the substrate 110. In this case, the gate driver circuit 112 may be a gate-in-panel (GIP) circuit, but the arrangement of the gate driver circuit 112 is not limited thereto.

The gate driver circuit 112 may be disposed between the active area AA and a dam 900. The high voltage lines VDD, the low voltage lines VSS, the multiplexer MUX (not shown), the ESD circuit (not shown), first connection lines 710, and second connection lines 720 may be disposed between the active area AA and the pad part 114 in the non-active area NA.

The high voltage lines VDD, the low voltage lines VSS, the multiplexer MUX, the first connection lines 710, and the second connection lines 720 may be disposed between the active area AA and the bent area BA.

The high voltage lines VDD, the low voltage lines VSS, the multiplexer MUX, the first connection lines 710, and the second connection lines 720 may be disposed in the non-bent area NBA adjacent to the active area AA.

The high voltage lines VDD, the first connection lines 710, and the second connection lines 720 may be disposed in the non-active area NA. For example, the high voltage lines VDD, the first connection lines 710, and the second connection lines 720 may be disposed in the non-bent areas NBA and the bent area BA of the non-active area NA. The first connection lines 710 and the second connection lines 720 may be configured to transfer a signal (i.e., a voltage) from the external module bonded to the pad part 114 to the active area AA or the circuit part, such as the gate driver circuit 112. For example, a variety of signals for driving the gate driver circuit 112 and a variety of other signals, such as a data signal, a high voltage, and a low voltage, may respectively be transferred through the first connection lines 710 and the second connection lines 720.

The high voltage lines VDD may be disposed to overlap the first connection lines 710, the second connection lines 720, and the dam 900. The first connection lines 710 and the second connection lines 720 may be disposed oblique to the high voltage lines VDD in an area in which the first connection lines 710 and the second connection lines 720 overlap the high voltage lines VDD.

The dam 900 may be disposed in the non-active area NA to surround the entirety or a portion of the active area AA. The dam 900 may be disposed adjacent to and outside of the active area AA.

The dam 900 may be disposed on the peripheral portions of the active area AA to control flow of a portion of an encapsulation layer which may include an organic material disposed on the light-emitting device layer. The dam 900 may be a single dam or may include a plurality of dams.

Hereinafter, the light-emitting display device according to an example embodiment of the present disclosure will be described in detail with reference to FIGS. 3 and 4.

Figure 3:
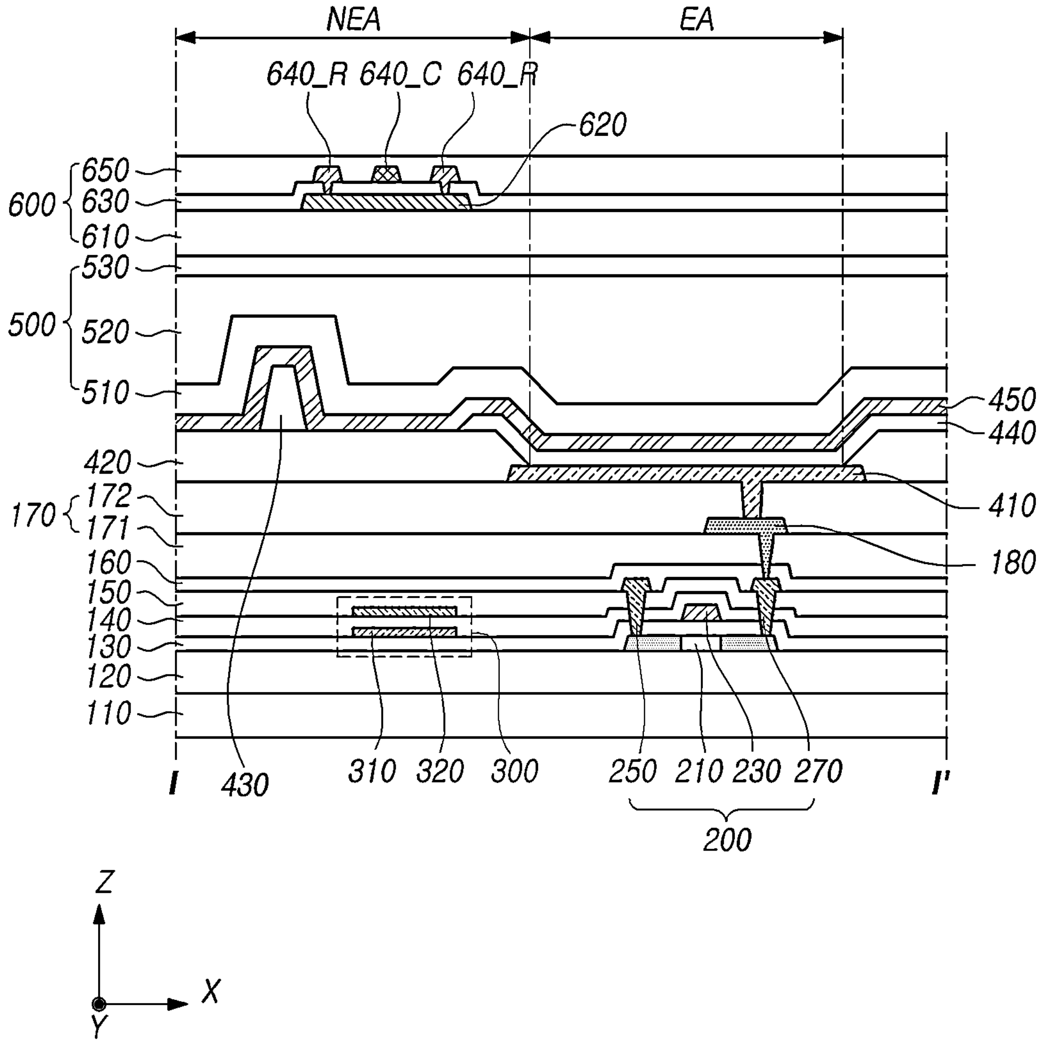
FIG. 3 is a cross-sectional view illustrating the light-emitting display device according to an example embodiment of the present disclosure.

FIG. 3 is a cross-sectional view illustrating the light-emitting display device according to an example embodiment of the present disclosure. For example, FIG. 3 illustrates an example cross-sectional structure taken along line I-I' in FIG. 2.

Figure 4:
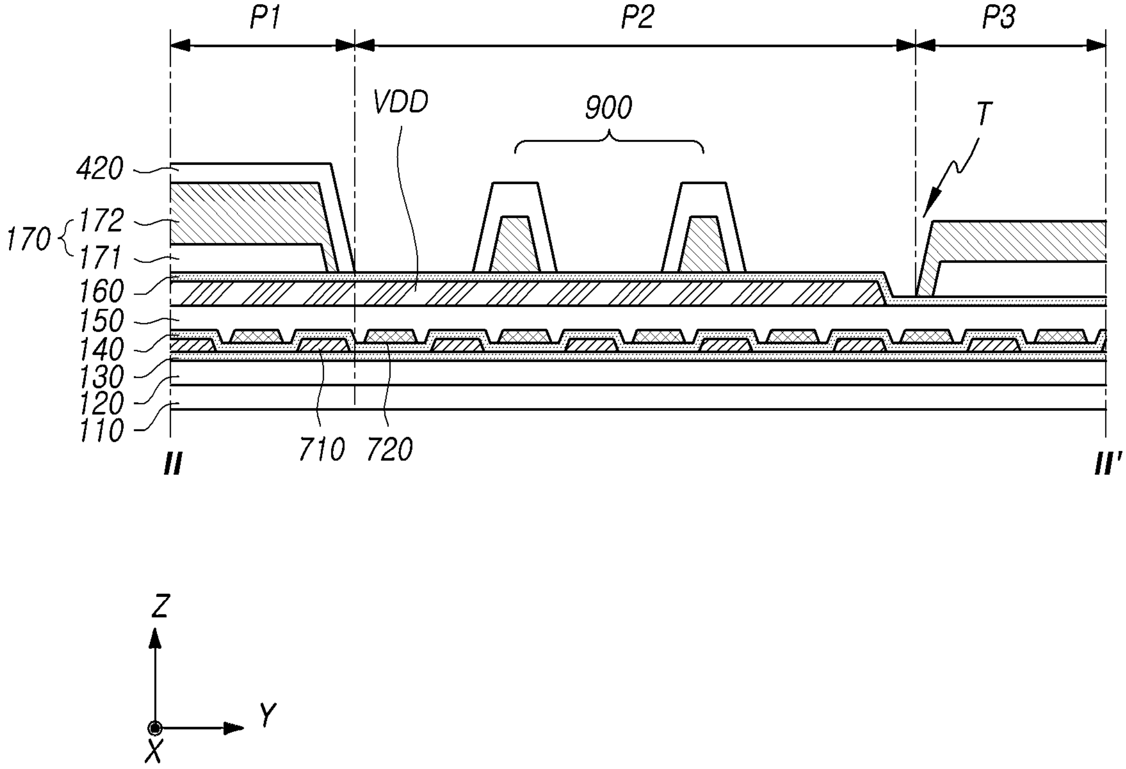
FIG. 4 is a cross-sectional view illustrating the non-active area of the light-emitting display device according to an example embodiment of the present disclosure.

FIG. 4 is a cross-sectional view illustrating the non-active area of the light-emitting display device according to an example embodiment of the present disclosure. For example, FIG. 4 illustrates an example cross-sectional structure taken along line II-II' in FIG. 2.

The substrate 110 may support a variety of components of the light-emitting display device. The substrate 110 may be formed of glass or a flexible plastic material.

For example, the substrate 110 may be formed of at least one selected from among polyimide (PI), poly(methyl methacrylate) (PMMA), polyethylene terephthalate (PET), polyethersulfone, and polycarbonate, but is not limited thereto.

Where the substrate 110 is formed of polyimide, the substrate 110 may include two polyimide layers. In addition, an inorganic film may be further disposed between the two polyimide layers. Alternatively, the substrate 110 may also include a plurality of polyimide layers. In addition, an inorganic film may be further disposed between any two polyimide layers among the plurality of polyimide layers.

The substrate 110 may conceptually include devices and function layers provided on the substrate 110, for example, a switching thin-film transistor, a driving thin-film transistor connected to the switching thin-film transistor, an OLED connected to the driving thin-film transistor, a passivation layer, and the like, but the structure is not limited thereto.

A buffer layer 120 may be disposed on the entire surface of the substrate 110.

The buffer layer 120 may include, for example, an inorganic insulating material, such as silicon nitride (SiNx) and silicon oxide (SiOx), or an organic insulating material, such as benzocyclobutene, an acrylic resin, an epoxy resin, a phenolic resin, a polyamide resin, and a polyimide resin, but is not limited thereto.

The buffer layer 120 may, for example, be a single layer or a multilayer of SiNx or SiOx. Where the buffer layer 120 has a multilayer structure, SiNx and SiOx may be alternately formed.

The buffer layer 120 may be omitted depending on the type and material of the substrate 110, the structure and type of the thin-film transistor, and the like.

The thin-film transistor 200 may be disposed on the buffer layer 120. The thin-film transistor 200 may include a semiconductor pattern 210, a gate electrode 230, a source electrode 250, and a drain electrode 270.

Although only the driving thin-film transistor 200 among a variety of thin-film transistors that may be included in the light-emitting display device 100 is illustrated for the sake of brevity, other thin-film transistors, such as a switching thin-film transistor, may be included in the light-emitting display device 100. In addition, although the thin-film transistor 200 is described as having a top gate structure for the sake of brevity, the thin-film transistor is not limited thereto and may have other structures, such as a bottom gate structure.

A semiconductor pattern 210 of the thin-film transistor 200 may be disposed on the buffer layer 120.

The semiconductor pattern 210 may be formed of a polycrystalline semiconductor. For example, the polycrystalline semiconductor may be low temperature polysilicon (LTPS) having low mobility but is not limited thereto. Where the semiconductor pattern 210 is formed of polycrystalline semiconductor or includes polycrystalline semiconductor, power consumption of the thin-film transistor 200 may be relatively low and reliability relatively high.

In addition, the semiconductor pattern 210 may include an oxide semiconductor. For example, the semiconductor pattern 210 may include one or more of indium-gallium-zinc-oxide (IGZO), indium-zinc-oxide (IZO), Indium-gallium-tin-oxide (IGTO), and indium-gallium-oxide (IGO), but is not limited thereto. Where the semiconductor pattern 210 is formed of an oxide semiconductor or includes an oxide semiconductor, a change in the luminance of the subpixels in low-speed driving may be reduced or minimized due to a superior leakage current blocking effect.

Where the semiconductor pattern 210 is formed of polycrystalline semiconductor or oxide semiconductor, or includes polycrystalline semiconductor or oxide semiconductor, a conductive portion may be present in a portion of the semiconductor pattern 210.

The semiconductor pattern 210 may be formed of amorphous silicon (a-Si) or a variety of organic semiconductor materials, such as pentacene, or may include amorphous silicon (a-Si) or a variety of organic semiconductor materials, such as pentacene, but is not limited thereto.

A first insulating layer 130 may be disposed in the entire area of the substrate 110 above the semiconductor pattern 210.

The first insulating layer 130 may be disposed between the semiconductor pattern 210 and a gate electrode 230 to insulate the semiconductor pattern 210 from the gate electrode 230. The first insulating layer 130 may include, for example, an inorganic insulating material, such as SiNx and SiOx, or an organic insulating material, such as benzocyclobutene, an acrylic resin, an epoxy resin, a phenolic resin, a polyamide resin, and a polyimide resin, but is not limited thereto.

The first insulating layer 130 may have holes through which a source electrode 250 and a drain electrode 270 of the thin-film transistor 200 are electrically connected to the semiconductor pattern 210.

The gate electrode 230 of the thin-film transistor 200 may be disposed on the first insulating layer 130. The gate electrode 230 may be disposed to overlap the semiconductor pattern 210.

A storage capacitor 300 may be disposed on the first insulating layer 130. The storage capacitor 300 may include a first capacitor electrode 310 and a second capacitor electrode 320. The storage capacitor 300 may store for a predetermined time a data voltage applied through a data line and may supply the stored data voltage to an anode 410.

The first capacitor electrode 310 of the storage capacitor 300 may be disposed on the first insulating layer 130.

Two or more first connection lines 710 may be disposed on the first insulating layer 130. The first connection lines 710 may be spaced apart from each other.

The gate electrode 230, the first capacitor electrode 310, and the first connection lines 710 may be disposed on the same layer. For example, the gate electrode 230, the first capacitor electrode 310, and the first connection lines 710 may be disposed on the first insulating layer 130, but present disclosure is not limited thereto.

The gate electrode 230, the first capacitor electrode 310, and the first connection lines 710 may be formed in the same process.

The gate electrode 230, the first capacitor electrode 310, and the first connection lines 710 may have a single-layer structure or a multilayer structure formed of one or more selected from among molybdenum (Mo), copper (Cu), titanium (Ti), aluminum (Al), chromium (Cr), gold (Au), nickel (Ni), neodymium (Nd), tungsten (W), a transparent conductive oxide (TCO), and alloys thereof, but is not limited thereto.

A second insulating layer 140 may be disposed in the entire area of the substrate 110 above the gate electrode 230, the first capacitor electrode 310, and the first connection lines 710.

The second insulating layer 140 may be disposed among the gate electrode 230, the source electrode 250, and the drain electrode 270 to insulate the gate electrode 230, the source electrode 250, and the drain electrode 270 from each other.

The second insulating layer 140 may have holes through which the source electrode 250 and the drain electrode 270 are electrically connected to the semiconductor pattern 210.

The second insulating layer 140 may include, for example, an inorganic insulating material, such as SiNx and SiOx, or an organic insulating material, such as benzocyclobutene, an acrylic resin, an epoxy resin, a phenolic resin, a polyamide resin, and a polyimide resin, but is not limited thereto.

The second capacitor electrode 320 of the storage capacitor 300 may be disposed on the second insulating layer 140.

The second capacitor electrode 320 may be disposed to overlap the first capacitor electrode 310.

Two or more second connection lines 720 may be disposed on the second insulating layer 140. The second connection lines 720 may be spaced apart from each other.

The second connection lines 720 may be disposed such that at least a portion of the second connection lines 720 does not overlap the first connection lines 710 disposed below the second connection lines 720 or below the second insulating layer 140.

The second capacitor electrode 320 and the second connection lines 720 may be disposed on the same layer. For example, the second capacitor electrode 320 and the second connection lines 720 may be disposed on the second insulating layer 140.

The second capacitor electrode 320 and the second connection lines 720 may be formed in the same process.

Each of the second capacitor electrode 320 and the second connection lines 720 may have a single-layer structure or a multilayer structure formed of one or more selected from among Mo, Cu, Ti, Al, Cr, Au, Ni, Nd, W, a transparent conductive oxide, and alloys thereof, but is not limited thereto.

A third insulating layer 150 may be disposed in the entire area of the substrate 110 above the second capacitor electrode 320 and the second connection lines 720.

The third insulating layer 150 may be disposed among the gate electrode 230, the source electrode 250, and the drain electrode 270 to insulate the gate electrode 230, the source electrode 250, and the drain electrode 270 from each other.

The third insulating layer 150 may include, for example, an inorganic insulating material, such as SiNx and SiOx, or an organic insulating material, such as benzocyclobutene, an acrylic resin, an epoxy resin, a phenolic resin, a polyamide resin, and a polyimide resin, but is not limited thereto.

The third insulating layer 150 may have holes through which the source electrode 250 and the drain electrode 270 are electrically connected to the semiconductor pattern 210.

The source electrode 250 and the drain electrode 270 may be disposed on the third insulating layer 150.

The source electrode 250 and the drain electrode 270 may be electrically connected to the semiconductor pattern 210 through the holes in the first insulating layer 130, the second insulating layer 140, and the third insulating layer 150.

The high voltage lines VDD may be disposed on the third insulating layer 150. The high voltage lines VDD may be disposed between the active area AA and the bent area BA of the non-active area, but the present disclosure is not limited thereto.

The source electrode 250, the drain electrode 270, and the high voltage lines VDD may be disposed on the same layer. For example, the source electrode 250, the drain electrode 270, and the high voltage lines VDD may be disposed on the third insulating layer 150, but the present disclosure is not limited thereto.

The source electrode 250, the drain electrode 270, and the high voltage lines VDD may be formed in the same process.

The low voltage lines VSS may be further disposed on the third insulating layer 150 although not illustrated in FIGS. 3 and 4. Low voltages may be supplied through the low voltage lines VSS.

Each of the source electrode 250, the drain electrode 270, and the high voltage lines VDD may have a single-layer structure or a multilayer structure formed of one or more selected from among Mo, Cu, Ti, Al, Cr, Au, Ni, Nd, W, a transparent conductive oxide, and alloys thereof, but is not limited thereto. For example, each of the source electrode 250, the drain electrode 270, and the high voltage lines VDD may have a three-layer structure of Ti/Al/Ti formed of conductive metal materials, but is not limited thereto.

A passivation layer 160 may be disposed in the entire area of the substrate 110 above the source electrode 250, the drain electrode 270, and the high voltage lines VDD.

The passivation layer 160 may protect the thin-film transistor 200. The passivation layer 160 may include, for example, an inorganic insulating material, such as SiNx and SiOx, or an organic insulating material, such as benzocyclobutene, an acrylic resin, an epoxy resin, a phenolic resin, a polyamide resin, and a polyimide resin, but is not limited thereto.

The passivation layer 160 may have a hole to electrically connect the thin-film transistor 200 and the anode 410.

The passivation layer 160 may cover the high voltage lines VDD disposed in the non-active area NA. For example, the passivation layer 160 may be disposed to cover top portions and/or side portions of the high voltage lines VDD, but is not limited thereto.

The passivation layer 160 may be omitted depending on the structure, type, or the like of the thin-film transistor.

A planarization layer 170 may be disposed on the passivation layer 160.

The planarization layer 170 may protect the thin-film transistor disposed below the planarization layer 170 and may reduce or planarize stepped portions caused by a variety of underneath patterns.

Although the planarization layer 170 may be provided as a single layer, two or more planarization layers may also be provided in consideration of the arrangement of electrodes.

Since a variety of signal lines increase as the resolution of the light-emitting display device 100 increases, it is difficult to dispose all conductive lines on a single layer while obtaining minimum distances between them. Thus, an additional layer may be provided. This additional layer may increase the degree of freedom of the arrangement of conductive lines, thereby making it easier to design the arrangement of conductive lines and/or electrodes. In addition, where the planarization layer 170 having a multilayer structure is formed of a dielectric material, the planarization layer 170 may be used to form capacitance between metal layers.

Where the planarization layer 170 is comprised of two layers (as shown in FIG. 3), the planarization layer 170 may include a first planarization layer 171 and a second planarization layer 172.

For example, a hole may be formed in the first planarization layer 171, and a connection electrode 180 may be disposed in the hole. The second planarization layer 172 having a hole may be disposed above the first planarization layer 171 and the connection electrode 180. The anode 410 may be disposed in the hole of the second planarization layer 172. Thus, the thin-film transistor 200 and the anode 410 may be electrically connected through the connection electrode 180.

One end (or a portion) of the connection electrode 180 may be connected to the thin-film transistor 200, and the other end (or another portion) of the connection electrode 180 may be connected to the anode 410.

Alternatively, the planarization layer 170 may also comprise three or more layers with holes so as to connect the thin-film transistor 200 with the anode 410.

As illustrated in FIG. 4, the non-active area NA may include a first portion P1, a second portion P2, and a third portion P3 as portions adjacent to the active area AA.

The first portion P1 may be a portion adjacent to the active area AA in a direction from the active area AA and in which the planarization layer 170 is disposed. The planarization layer 170 in the first portion P1 may be provided such that the planarization layer disposed in the active area AA extends to the non-active area NA. The first portion P1 may further include a bank 420 above the planarization layer 170.

The second portion P2 of the non-active area NA may be a portion adjacent to the first portion P1 in a direction away from the active area AA and from which the planarization layer 170 is removed by etching.

The third portion P3 of the non-active area NA is adjacent to the second portion P2 in a direction away from the active area AA (e.g., in the Y-axis direction). The third portion P3 may be disposed to surround the second portion P2. The third portion P3 may be a portion of the non-active area NA in which the planarization layer 170 is disposed.

The second portion P2 may be disposed between the first portion P1 and the third portion P3. For example, the second portion P2 may be a portion between one edge of the bank 420 disposed in the first portion P1 and one edge of the planarization layer 170 disposed in the third portion P3, but the present disclosure is not limited thereto.

The dam 900 may be disposed in the second portion P2. For example, by disposing the dam 900 in the second portion P2 from which the planarization layer 170 is etched, an encapsulation layer 500 formed of an organic material may be prevented from outflowing toward driving devices during processing before the encapsulation layer 500 is cured. The dam 900 may include one pattern or a plurality of patterns.

The dam 900 may be disposed along the outer perimeter of the active area AA. The dam 900 may be disposed along the first portion P1 of the non-active area NA. The dam 900 may be disposed between the first portion P1 and the third portion P3 or the bent area BA.

The dam 900 may be formed as a multilayer structure using one or more materials. For example, where the dam 900 has a multilayer structure, the dam 900 may be formed of the same or substantially the same material as at least one of the second planarization layer 172 and the bank 420 and may be simultaneously formed when the second planarization layer 172 and the bank 420 are formed, but the present disclosure is not limited thereto.

Here, if at least a portion of the planarization layer 170 in the third portion P3 overlaps or is in contact with at least a portion of ends of the high voltage lines VDD, the high voltage lines VDD may be a passage through which moisture or oxygen of the planarization layer 170 may infiltrate. Moisture or oxygen of the planarization layer 170 may infiltrate into the active area AA through the high voltage lines VDD, thereby causing a problem or limitation such as abnormal driving of the thin-film transistor.

In this regard, the inventors of the present disclosure have invented a display device that includes a trench T between the high voltage lines VDD and the planarization layer 170 disposed in the third portion P3 to block or reduce permeation of oxygen or moisture in the planarization layer 170 into the active area AA. In this manner, reliability of the thin-film transistor and thus the display quality may be improved.

As shown in FIG. 4, the trench T may cause the planarization layer 170 disposed in the third portion P3 and the high voltage lines VDD to be spaced apart. The trench T may be included in a separated area between the high voltage lines VDD and the planarization layer 170 in the third portion P3. Since the high voltage lines VDD and the planarization layer 170 are spaced apart by the trench T, infiltration of moisture or oxygen into the active area AA through the high voltage lines VDD may be blocked or reduced. In the trench T, the passivation layer 160 may be exposed.

As shown in FIG. 3, the connection electrode 180 may be disposed on the first planarization layer 171.

The connection electrode 180 may have a single-layer structure or a multilayer structure formed of one or more selected from among Mo, Cu, Ti, Al, Cr, Au, Ni, Nd, W, a transparent conductive oxide, and alloys thereof, but is not limited thereto.

Each of the first planarization layer 171 and the second planarization layer 172 may be formed of at least one material selected from among benzocyclobutene (BCB), an acrylic resin, an epoxy resin, a phenolic resin, a polyamide resin, and a polyimide resin, but is not limited thereto. The connection electrode 180 may be omitted on the basis of the structure, type, or the like of the light-emitting display device.

The anode 410 may be disposed on the planarization layer 170.

Where the light-emitting display device 100 is a top emission display device, the anode 410 may be implemented as a light reflecting electrode formed of an opaque conductive material. The anode 410 may be formed of at least one selected from among silver (Ag), aluminum (Al), gold (Au), molybdenum (Mo), tungsten (W), chromium (Cr), and alloys thereof, but is not limited thereto. For example, the anode 410 may have a three-layer structure of Ag/Pd/Cu but is not limited thereto. Alternatively, the anode 410 may further include a transparent conductive material layer having a high work function, such as indium-tin-oxide (ITO).

Where the light-emitting display device 100 is a bottom emission display device, the anode 410 may be formed of a transparent conductive material allowing light to pass therethrough. For example, the anode 410 may be formed of at least one of indium-tin-oxide (ITO) and indium zinc oxide (IZO).

The bank 420 may be disposed on the anode 410 and the planarization layer 170.

The bank 420 may divide the plurality of subpixels SP to reduce or minimize light leaks and to prevent or reduce color mixing occurring in various fields of view.

The bank 420 may define (or divide) a light-emitting part EA and a non-light-emitting part NEA. The bank 420 may be disposed in the non-light-emitting part NEA.

The bank 420 may have a bank hole through which the light-emitting part EA and the anode 410 are exposed.

The bank 420 may be formed of at least one selected from among inorganic insulating materials, such as SiNx and SiOx, organic insulating materials, such as benzocyclobutene, an acrylic resin, an epoxy resin, a phenolic resin, a polyamide resin, and a polyimide resin, and a photosensitizer (or photoresist) including a black pigment, but is not limited thereto.

The bank 420 may be formed to be transparent, black, or colored. The bank 420 may be disposed to cover an end portion or end portions of the anode 410.

In addition, the bank 420 may be disposed on the planarization layer 170 in the non-active area NA.

The bank 420 may be disposed in the first portion P1 of the non-active area. An edge of the bank 420 may divide the first portion P1 and the second portion P2. For example, the first portion P1 may be an area from an edge of the active area AA to an edge of the bank 420, and the second portion P2 may be an area in which the bank 420 is not disposed.

The bank 420 in the first portion P1 may be disposed to extend from a bank disposed in the active area AA.

At least one spacer 430 may be disposed on the bank 420.

The spacer 430 may prevent or reduce a light-emitting device layer 440 from being damaged during processing of the light-emitting device layer 440 and reduce or minimize the fracture of the light-emitting display device 100 due to external impact.

The spacer 430 may be formed of the same or substantially the same material as the bank 420 and may be formed at the same time as or in a different process from the bank 420.

The height of the spacer 430 may be greater than the thickness of the bank 420. The height of the spacer 430 may be in the range of 1 μm to 2 μm.

The light-emitting device layer 440 may be disposed on the anode 410 and the bank 420. The light-emitting device layer 440 may include one of a red organic light-emitting device layer, a green organic light-emitting device layer, a blue organic light-emitting device layer, and a white organic light-emitting device layer such that light having a specific color may be generated from each of the subpixels SP. Where the light-emitting device layer 440 includes a white organic light-emitting device layer, a color filter for converting white light from the white organic light-emitting device layer into light having another color (e.g., red, green, or blue) may be disposed above the light-emitting device layer 440. In addition, the light-emitting device layer 440 may further include a hole injection layer, a hole transport layer, an electron transport layer, an electron injection layer, and the like, in addition to the emitting layer, but is not limited thereto.

The emitting layer of the light-emitting device layer 440 may be disposed in each of the subpixels SP. The hole injection layer, the hole transport layer, the electron transport layer, and the electron injection layer of the light-emitting device layer 440 may be disposed in the entire active area AA.

A plurality of light-emitting device layers 440 may be disposed in each of the subpixels SP. In this case, a charge generation layer may further be provided between two or more light-emitting device layers 440.

A cathode 450 may be disposed on the light-emitting device layer 440. The cathode 450 serves to supply electrons to the light-emitting device layer 440 and may be formed of a material having a low work function.

Where the light-emitting display device 100 is a top emission display device, the cathode 450 may be formed of a transparent conductive material allowing light to pass therethrough. For example, the cathode 450 may be formed of at least one of ITO and IZO, but is not limited thereto.

The cathode 450 may be formed of a translucent conductive material. For example, the cathode 450 may be formed of at least one selected from among alloys, such as LiF/Al, CsF/Al, Mg:Ag, Ca/Ag, Ca:Ag, LiF/Mg:Ag, LiF/Ca/Ag, and LiF/Ca:Ag, but is not limited thereto.

Where the light-emitting display device 100 is a bottom emission display device, the cathode 450 may be implemented as a light reflecting electrode formed of an opaque conductive material. For example, the cathode 450 may be formed of at least one selected from among Ag, Al, Au, Mo, W, Cr, and alloys thereof.

An encapsulation layer 500 may be disposed on the cathode 450. The encapsulation layer 500 may protect the light-emitting device layer 440 from external moisture, oxygen, or foreign matter. For example, the encapsulation layer 500 may prevent or reduce permeation of oxygen and moisture from the outside in order to prevent or reduce the light-emitting material and the electrode material from oxidizing.

The encapsulation layer 500 may be formed of a transparent material allowing light generated by the emitting layer to pass therethrough.

The encapsulation layer 500 may include a first encapsulation layer 510, a second encapsulation layer 520, and a third encapsulation layer 530 to prevent or reduce permeation of moisture and oxygen. The first encapsulation layer 510, the second encapsulation layer 520, and the third encapsulation layer 530 may be configured to be alternately stacked on each other.

Each of the first encapsulation layer 510 and the third encapsulation layer 530 may be formed of at least one inorganic material selected from among silicon nitride (SiNx), silicon oxide (SiOx), and aluminum oxide (AlyOz), but is not limited thereto. Each of the first encapsulation layer 510 and the third encapsulation layer 530 may be formed by a vacuum deposition method, such as physical vapor deposition (PVD), chemical vapor deposition (CVD) and atomic layer deposition (ALD), but the present disclosure is not limited thereto.

Each of the first encapsulation layer 510 and the third encapsulation layer 530 may be formed as two or more layers. For example, the first encapsulation layer 510 may have a three-layer structure of SiOx/SiNx/SiOx but is not limited thereto. Alternatively, the first encapsulation layer 510 may have a four-layer structure of SiOx/SiNx/SiOx/SiOx but is not limited thereto.

The second encapsulation layer 520 may cover foreign matter or particles that may occur during fabrication processing. In addition, the second encapsulation layer 520 may planarize the surface of the first encapsulation layer 510. For example, the second encapsulation layer 520 may be a particle cover layer but is not limited to the term.

The second encapsulation layer 520 may be formed of an organic material, for example, a polymer, such as silicon oxycarbon (SiOCz) epoxy, polyimide, polyethylene, and acrylate, but is not limited thereto.

The second encapsulation layer 520 may be formed of a thermosetting material or a light-curing material that is hardened by heat or light.

The touch sensor layer 600 may be disposed on the encapsulation layer 500.

The touch sensor layer 600 may include first touch electrodes 640_R, a first touch connection electrode 620, second touch electrodes (not shown), and a second touch connection electrode 640_C.

At least a portion of the first touch electrodes 640_R, the first touch connection electrode 620, the second touch electrodes, and the second touch connection electrode 640_C may be disposed to overlap the bank 420.

The first touch electrodes 640_R, the second touch electrodes, the first touch connection electrode 620, and the second touch connection electrode 640_C may have a mesh pattern formed by intersecting metal lines having a small line width. The mesh pattern may have a rhombic shape. The shape of the mesh pattern may be one selected from among a rectangle, a pentagon, a hexagon, a circle, and an ellipse, but is not limited thereto.

Each of the first touch electrodes 640_R, the second touch electrodes, the first touch connection electrode 620, and the and second touch connection electrode 640_C may be formed of an opaque conductive material having low resistance. For example, each of the first touch electrodes 640_R, the second touch electrodes, the first touch connection electrode 620, and the and second touch connection electrode 640_C may have a single-layer structure or a multi-layer structure formed of one or more selected from among Mo, Cu, Ti, Al, Cr, Au, Ni, Nd, W, a transparent conductive oxide, and alloys thereof, but is not limited thereto.

For example, each of the first touch electrodes 640_R, the second touch electrodes, the first touch connection electrode 620, and the and second touch connection electrode 640_C may have a three-layer structure of Ti/Al/Ti formed of conductive metals but is not limited thereto.

The first touch electrodes 640_R, the second touch electrodes, the first touch connection electrode 620, and the and second touch connection electrode 640_C may be formed of the same or substantially the same material as the source electrode 250 and the drain electrode 270.

A touch buffer layer 610 may be disposed on the encapsulation layer 500. The touch buffer layer 610 may block or reduce a chemical liquid (e.g., a developer or etchant) used in fabrication processing of the touch sensor layer 600, external moisture, and the like from permeating into the light-emitting device layer 440. In addition, it is possible to prevent or reduce a plurality of touch sensor metals disposed above the touch buffer layer 610 from being short-circuited by external impact and to block or reduce an interference signal that may occur when the touch sensor layer is driven.

The touch buffer layer 610 may be formed of at least one selected from among inorganic insulating materials, such as SiNx and SiOx, and organic insulating materials, such as benzocyclobutene, an acrylic resin, an epoxy resin, a phenolic resin, a polyamide resin, and a polyimide resin, but is not limited thereto.

The first touch connection electrode 620 may be disposed on the touch buffer layer 610.

For example, the first touch connection electrode 620 may be disposed between the first touch electrodes 640_R adjacent to each other in the first direction (or X-axis direction). The first touch connection electrode 620 may electrically connect the first touch electrodes 640_R disposed adjacent to each other in the first direction (or X-axis direction), but is not limited thereto.

The first touch connection electrode 620 may be disposed to overlap the second touch connection electrode 640_C connecting the second touch electrodes (not shown) adjacent to each other in the second direction (or Y-axis direction perpendicular to the X-axis direction). The first touch connection electrode 620 and the second touch connection electrode 640_C may be disposed on different layers and may be electrically insulated from each other.

A touch insulating layer 630 may be disposed on the touch buffer layer 610 and the first touch connection electrode 620.

The touch insulating layer 630 may have holes through which the first touch electrodes 640_R and the first touch connection electrode 620 are electrically connected to one another.

The touch insulating layer 630 may electrically insulate the first touch connection electrode 620 and the second touch connection electrode 640_C.

The touch insulating layer 630 may be a single layer or a multilayer of SiNx or SiOx, but is not limited thereto.

The first touch electrodes 640_R, the second touch electrodes, and the second touch connection electrode 640_C may be disposed on the touch insulating layer 630.

The first touch electrodes 640_R may be spaced apart by a predetermined distance from the second touch electrodes. The first touch electrodes 640_R adjacent to each other in the first direction (or X-axis direction) may be spaced apart from each other. The first touch electrodes 640_R adjacent to each other in the first direction (or X-axis direction) may be connected to the first touch connection electrode 620 disposed between two or more first touch electrodes 640_R. For example, the adjacent first touch electrodes 640_R may be connected to the first touch connection electrode 620 through holes in the touch insulating layer 630.

The second touch electrodes adjacent to each other in the second direction (or Y-axis direction) may be connected to each other by the second touch connection electrode 640_C. The second touch electrodes and the second touch connection electrode 640_C may be disposed on the same layer. For example, the second touch connection electrode 640_C may be disposed on the same layer as and between the second touch electrodes. The second touch connection electrode 640_C may extend from the second touch electrodes.

The first touch electrodes 640_R, the second touch electrodes, and the second touch connection electrode 640_C may be formed in the same process.

A touch planarization layer 650 may be disposed on the first touch electrodes 640_R, the second touch electrodes, and the second touch connection electrode 640_C.

The touch driver circuit may receive a touch sensing signal from the first touch electrodes 640_R. In addition, the touch driver circuit may transmit a touch driving signal from the second touch electrodes. The touch driver circuit may determine a user touch using mutual capacitance between two or more first touch electrodes 640_R and two or more second touch electrodes. For example, when a touch operation is performed in the light-emitting display device 100, a change in capacitance between the first touch electrodes 640_R and the second touch electrodes may occur. The touch driver circuit may determine touch coordinates by detecting such a change in capacitance.

Figure 5:
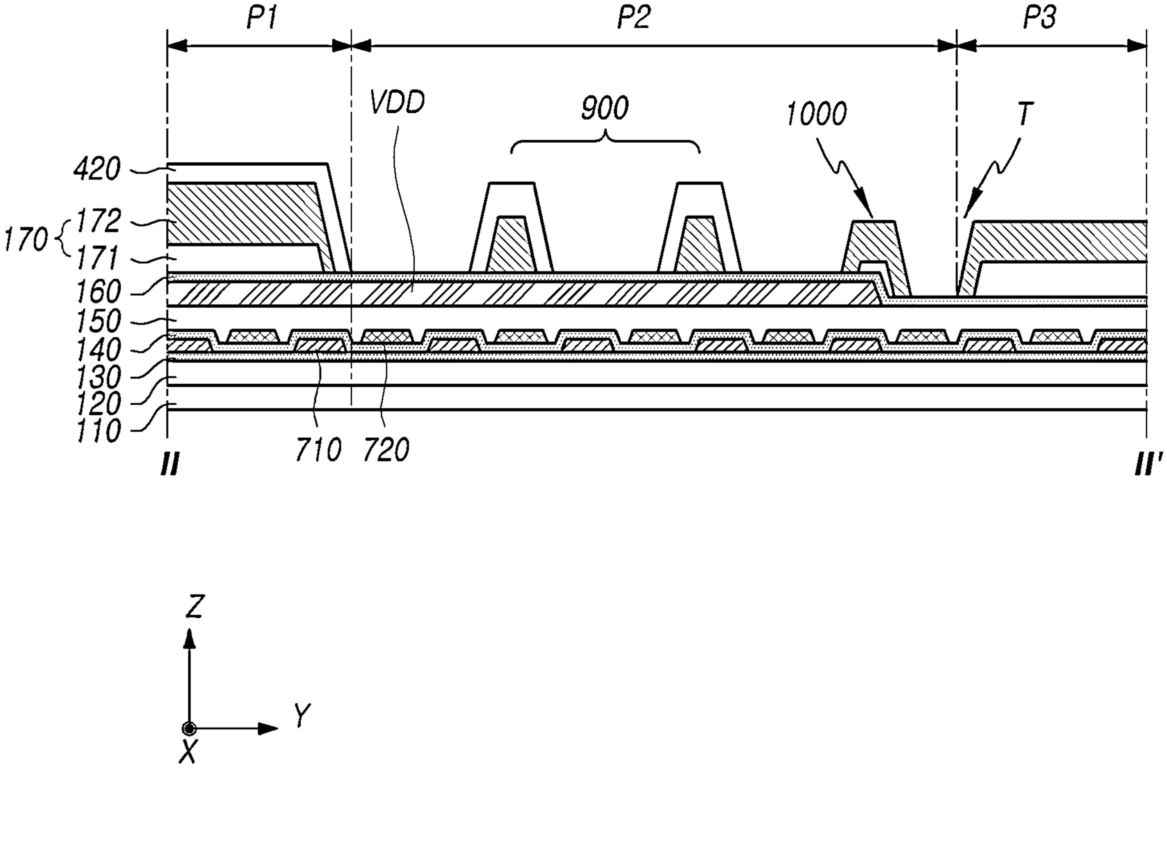
FIG. 5 is a cross-sectional diagram illustrating a light-emitting display device according to another example embodiment of the present disclosure.

FIG. 5 is a cross-sectional diagram illustrating a light-emitting display device 100 according to another example embodiment of the present disclosure.

The light-emitting display device 100 according to another example embodiment of the present disclosure may further include a blocking layer 1000 disposed in the second portion P2.

The example light-emitting display device 100 illustrated in FIG. 5 is substantially the same as the example light-emitting display device illustrated in FIG. 4, except for the blocking layer 1000. Thus, a redundant description thereof will be omitted.

As illustrated in FIG. 5, the light-emitting display device 100 may further include the blocking layer 1000 disposed in the second portion P2.

The blocking layer 1000 may be disposed along the outer perimeter of the active area AA. Alternatively, the blocking layer 1000 may be disposed along the dam 900 disposed in the second portion P2 of the non-active area NA. The blocking layer 1000 may be disposed between the first portion P1 and the third portion P3 or the bent area BA.

At least a portion of the blocking layer 1000 may overlap the high voltage lines VDD disposed below the blocking layer 1000. For example, at least a portion of the blocking layer 1000 may overlap ends of the high voltage lines VDD disposed below the blocking layer 1000. Where at least a portion of the blocking layer 1000 overlaps the ends of the high voltage lines VDD, a bottom portion of the blocking layer 1000 may be stepped due to stepped portions of the ends of the high voltage lines VDD.

The blocking layer 1000 may have a multilayer structure formed of at least one material. For example, where the blocking layer 1000 has a multilayer structure, the blocking layer 1000 may be formed of the same or substantially the same material as at least one of the first planarization layer 171 and the second planarization layer 172 and be simultaneously formed when the first planarization layer 171 and the second planarization layer 172 are formed, but the present disclosure is not limited thereto.

The high voltage lines VDD may be spaced apart from the planarization layer 170 disposed in the third portion P3. The light-emitting display device may include the trench T between the high voltage lines VDD and the planarization layer 170 disposed in the third portion P3, and in an area between the blocking layer 1000 in the second portion P2 and the planarization layer 170 disposed in the third portion P3. Since the high voltage lines VDD are spaced apart from the planarization layer 170 in the third portion P3 by the trench T, it is possible to block or reduce infiltration of moisture or oxygen toward the active area AA through the high voltage lines VDD.

In the trench T, the passivation layer 160 may be exposed.

Example embodiments of the present disclosure may be described as follows.

A light-emitting display device according to an embodiment of the present disclosure may include: a substrate including an active area and a non-active area, the non-active area including a first portion adjacent to the active area, a second portion adjacent to the first portion, and a third portion adjacent to the second portion in a first direction away from the active area; a planarization layer disposed in the active area and in the first portion and the third portion of the non-active area; and a power line disposed in the first portion and the second portion of the non-active area, wherein the power line may be spaced apart from the planarization layer in the third portion of the non-active area.

According to some embodiments of the present disclosure, a trench may be disposed in the second portion of the non-active area between the power line and the planarization layer in the third portion of the non-active area.

According to some embodiments of the present disclosure, the light-emitting display device may further comprise a blocking layer between the power line in the second portion and the planarization layer in the third portion.

According to some embodiments of the present disclosure, the light-emitting display device may further comprise a passivation layer disposed to cover at least a portion of the power line and disposed under the blocking layer and the planarization layer in the third portion, wherein the passivation layer may be exposed in the trench.

According to some embodiments of the present disclosure, the trench may be disposed between the blocking layer and the planarization layer in the third portion.

According to some embodiments of the present disclosure, at least a portion of the power line may overlap at least a portion of the blocking layer.

According to some embodiments of the present disclosure, a bottom portion of the blocking layer may have a stepped shape with respect to the passivation layer.

According to some embodiments of the present disclosure, the planarization layer may comprise a first planarization layer and a second planarization layer on the first planarization layer, and the blocking layer may comprise a same material as at least one of the first planarization layer and the second planarization layer.

According to some embodiments of the present disclosure, the light-emitting display device may further comprise a passivation layer disposed in the active area and the non-active area on the power line and under the planarization layer, wherein the passivation layer may be exposed in the trench.

According to some embodiments of the present disclosure, the power line disposed in the second portion may be spaced apart from the planarization layer in the third portion in a direction parallel with the first direction.

According to some embodiments of the present disclosure, the planarization layer may include: a first part disposed in the active area and the first portion of the non-active area; and a second part disposed in the third portion of the non-active area and spaced apart from the first part.

According to some embodiments of the present disclosure, the power line may include an end in the second portion of the non-active area, the end of the power line being spaced apart in a direction parallel with the first direction from the second part of the planarization layer in the third portion of the non-active area.

According to some embodiments of the present disclosure, the light-emitting display device may further comprise a trench between the end of the power line and the second part of the planarization layer.

According to some embodiments of the present disclosure, the light-emitting display device may further comprise one or more dams disposed in the second portion of the non-active area.

According to some embodiments of the present disclosure, each of the one or more dams may have a multilayer structure including one or more materials.

According to some embodiments of the present disclosure, the one or more dams may include a same material as the planarization layer.

According to some embodiments of the present disclosure, the one or more dams may be disposed on the power line in the second portion of the non-active area.

According to some embodiments of the present disclosure, the light-emitting display device may further comprise a plurality of first connection lines and a plurality of second connection lines, the first connection lines and second connection lines being disposed under the power line and the planarization layer.

According to some embodiments of the present disclosure, the light-emitting display device may further comprise: a thin-film transistor disposed in the active area under the planarization layer and comprising a semiconductor pattern, a gate electrode, a source electrode, and a drain electrode; and a storage capacitor in the active area under the planarization layer and comprising a first capacitor electrode and a second capacitor electrode.

According to some embodiments of the present disclosure, the first connection lines are disposed on a same layer as the gate electrode, and the second connection lines are disposed on a same layer as the second capacitor electrode.

As set forth above, specific example embodiments of the present disclosure have been described in more detail with reference to the accompanying drawings. However, the present disclosure is not limited to the foregoing example embodiments, but a variety of modifications are possible without departing from the principle of the present disclosure. Thus, the foregoing example embodiments disclosed herein should be interpreted as being illustrative, while not being limiting, of the principle of the present disclosure, and the scope of the principle of the present disclosure is not limited to the foregoing example embodiments. Therefore, the foregoing example embodiments should not be construed as being exhaustive in any aspects.

It will be apparent to those skilled in the art that various modifications and variations can be made in the present disclosure without departing from the spirit or scope of the disclosures. Thus, it is intended that the present disclosure cover such modifications and variations of this disclosure.

What is claimed is:

1. A light-emitting display device, comprising:

a substrate including an active area and a non-active area, the non-active area including a first portion adjacent to the active area, a second portion adjacent to the first portion, and a third portion adjacent to the second portion in a first direction away from the active area;

a planarization layer disposed in the active area and in the first portion and the third portion of the non-active area; and a power line disposed in the first portion and the second portion of the non-active area, wherein the power line is spaced apart from the planarization layer in the third portion of the non-active area, and wherein a trench is disposed in the second portion of the non-active area between the power line and the planarization layer in the third portion of the non-active area.

2. The light-emitting display device of claim 1, further comprising a blocking layer between the power line in the second portion and the planarization layer in the third portion.

3. The light-emitting display device of claim 2, further comprising a passivation layer disposed to cover at least a portion of the power line and disposed under the blocking layer and the planarization layer in the third portion, wherein the passivation layer is exposed in the trench.

4. The light-emitting display device of claim 2, wherein the trench is disposed between the blocking layer and the planarization layer in the third portion.

5. The light-emitting display device of claim 2, wherein at least a portion of the power line overlaps at least a portion of the blocking layer.

6. The light-emitting display device of claim 3, wherein a bottom portion of the blocking layer has a stepped shape with respect to the passivation layer.

7. The light-emitting display device of claim 2, wherein:

the planarization layer comprises a first planarization layer and a second planarization layer on the first planarization layer, and the blocking layer comprises a same material as at least one of the first planarization layer and the second planarization layer.

8. The light-emitting display device of claim 1, further comprising a passivation layer disposed in the active area and the non-active area on the power line and under the planarization layer, wherein the passivation layer is exposed in the trench.

9. The light-emitting display device of claim 1, wherein the power line disposed in the second portion is spaced apart from the planarization layer in the third portion in a direction parallel with the first direction.

10. The light-emitting display device of claim 1, wherein the planarization layer includes:

a first part disposed in the active area and the first portion of the non-active area; and a second part disposed in the third portion of the non-active area and spaced apart from the first part.

11. The light-emitting display device of claim 10, wherein the power line includes an end in the second portion of the non-active area, the end of the power line being spaced apart in a direction parallel with the first direction from the second part of the planarization layer in the third portion of the non-active area.

12. The light-emitting display device of claim 11, wherein the trench is disposed between the end of the power line and the second part of the planarization layer.

13. The light-emitting display device of claim 1, further comprising one or more dams disposed in the second portion of the non-active area.

14. The light-emitting display device of claim 13, wherein each of the one or more dams has a multilayer structure including one or more materials.

15. The light-emitting display device of claim 13, wherein the one or more dams include a same material as the planarization layer.

16. The light-emitting display device of claim 13, wherein the one or more dams are disposed on the power line in the second portion of the non-active area.

17. The light-emitting display device of claim 1, further comprising a plurality of first connection lines and a plurality of second connection lines, the first connection lines and second connection lines being disposed under the power line and the planarization layer.

18. The light-emitting display device of claim 17, further comprising:

a thin-film transistor disposed in the active area under the planarization layer and comprising a semiconductor pattern, a gate electrode, a source electrode, and a drain electrode; and a storage capacitor in the active area under the planarization layer and comprising a first capacitor electrode and a second capacitor electrode.

19. The light-emitting display device of claim 18, wherein the first connection lines are disposed on a same layer as the gate electrode, and the second connection lines are disposed on a same layer as the second capacitor electrode.

20. A light-emitting display device, comprising:

a substrate including an active area and a non-active area, the non-active area including a first portion adjacent to the active area, a second portion adjacent to the first portion, and a third portion adjacent to the second portion in a first direction away from the active area;

a planarization layer disposed in the active area and in the first portion and the third portion of the non-active area;

one or more dams disposed in the second portion of the non-active area; and a power line disposed in the first portion and the second portion of the non-active area, wherein the power line is spaced apart from the planarization layer in the third portion of the non-active area.

* * * * *